(12) United States Patent
Schneider

(10) Patent No.: US 7,629,901 B1
(45) Date of Patent: Dec. 8, 2009

(54) MECHANISM FOR MODELING ESCAPE COUNTS IN ADAPTIVE COMPRESSION MODELS

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 64 days.

(21) Appl. No.: 12/152,713

(22) Filed: May 16, 2008

(51) Int. Cl.
*H03M 7/40* (2006.01)
(52) U.S. Cl. .......................................... 341/51; 341/67
(58) Field of Classification Search ............... 341/51, 341/65, 67, 107, 50; 382/246, 239, 232, 382/233
See application file for complete search history.

(56) References Cited

U.S. PATENT DOCUMENTS 5,260,693 A * 11/1993 Horsley ........................ 341/67

OTHER PUBLICATIONS

U.S. Appl. No. 11/948,954, filed Nov. 30, 2007, Schneider.
U.S. Appl. No. 12/072,879, filed Feb. 27, 2008, Schneider.

* cited by examiner

*Primary Examiner*—Rexford N Barnie
*Assistant Examiner*—Joseph Lauture
(74) *Attorney, Agent, or Firm*—Blakely, Sokoloff, Taylor & Zafman LLP

(57) ABSTRACT

In one embodiment, a mechanism for modeling escape counts in adaptive compression models is disclosed. In one embodiment, a method includes initializing an escape count for an escape symbol used in an adaptive compression context model that encodes an input stream, the initial escape count being initialized at a high value in an upper portion of a range of possible count values, invoking the adaptive compression context model with the initial escape count for the escape symbol, incrementing the escape count each time it is utilized in the adaptive compression context model, and scaling the escape count when it exceeds a maximum count value.

20 Claims, 9 Drawing Sheets

```
struct Context_Structure
{
        void    *Parent_Pointer;

void    *Child_Pointer[256];

int     Count_Value[257];

/ # MECHANISM FOR MODELING ESCAPE COUNTS IN ADAPTIVE COMPRESSION MODELS

TECHNICAL FIELD

The embodiments of the invention relate generally to data compression and, more specifically, relate to modeling escape counts in adaptive compression models.

BACKGROUND

Traditional entropy encoding compression algorithms (such as Huffman coding, adaptive Huffman coding or arithmetic coding) depend on having a statistical model of the input stream they are compressing. The more accurately the model represents the actual statistical properties of symbols in the input stream, the better the algorithm is able to compress the stream. Loosely speaking, the model is used to make a prediction about what input symbol will come next in the input stream. For example, if the input stream is English-language text, the model would assign a higher probability to the letter 'e' than to the letter 'Q' (usually).

The probability model can be static (i.e., unchanging for the duration of a compression process) or adaptive (i.e., evolving as the compressor processes the input data stream). The probability model can also take into account one or more of the most recently encountered input symbols to take advantage of local correlations. For example, in English text, encountering a letter 'Q' or 'q' in the input stream makes it more likely that the next character will be 'u'.

An adaptive model typically works by matching the current input symbol against its prediction context, and if it finds the current input symbol in its context, generating a code representing the particular probability range that the input symbol represents. For example, if the current input symbol is 'e' and the model predicts that the probability of 'e' is in the range 0.13 to 0.47, then the compressor would generate an output code representing that probability range. Once the symbol is encoded, the compressor updates the probability model. This "code and update" cycle is repeated until there are no more input symbols to compress.

One commonly used adaptive model is called "prediction by partial matching" (PPM). The PPM coding model counts the occurrence of each symbol in the contexts in which it occurs. One problem with PPM coding model encounters is determining how to account for codes that do not occur in the context driving your coding. When the compressor encounters a new symbol for which its model has no prediction, it must do something else. Consequently, a solution to address new symbols by the model includes encoding a special "escape" symbol to signal to the decompressor that the next symbol is a literal value. The escapes are used because the other option of including every possible symbol in every context leads to a poor performance (including possible data expansion).

Typically, at the beginning of encoding using an adaptive coding model, a substantial amount of escape tokens are emitted and, thus, more bits may be needed to encode these escape tokens. Every entropy encoder strives to reduce the number of bits used to represent a block of data by trying to model the probabilities of the data items being coded (typically, this is in bytes, but it can be bits or words). The more accurate this model, the fewer bits are needed for the encoding. Therefore, a mechanism to model escape counts in adaptive compression models in a way that reduces the number of bits used to represent a block of data by accurately representing the escape probability would be beneficial.

BRIEF DESCRIPTION OF THE DRAWINGS

The invention will be understood more fully from the detailed description given below and from the accompanying drawings of various embodiments of the invention. The drawings, however, should not be taken to limit the invention to the specific embodiments, but are for explanation and understanding only.

FIGS. 4-5 are data structures that may be used for encoding and decoding processes according to one embodiment of the invention;

DETAILED DESCRIPTION

Figure 1:
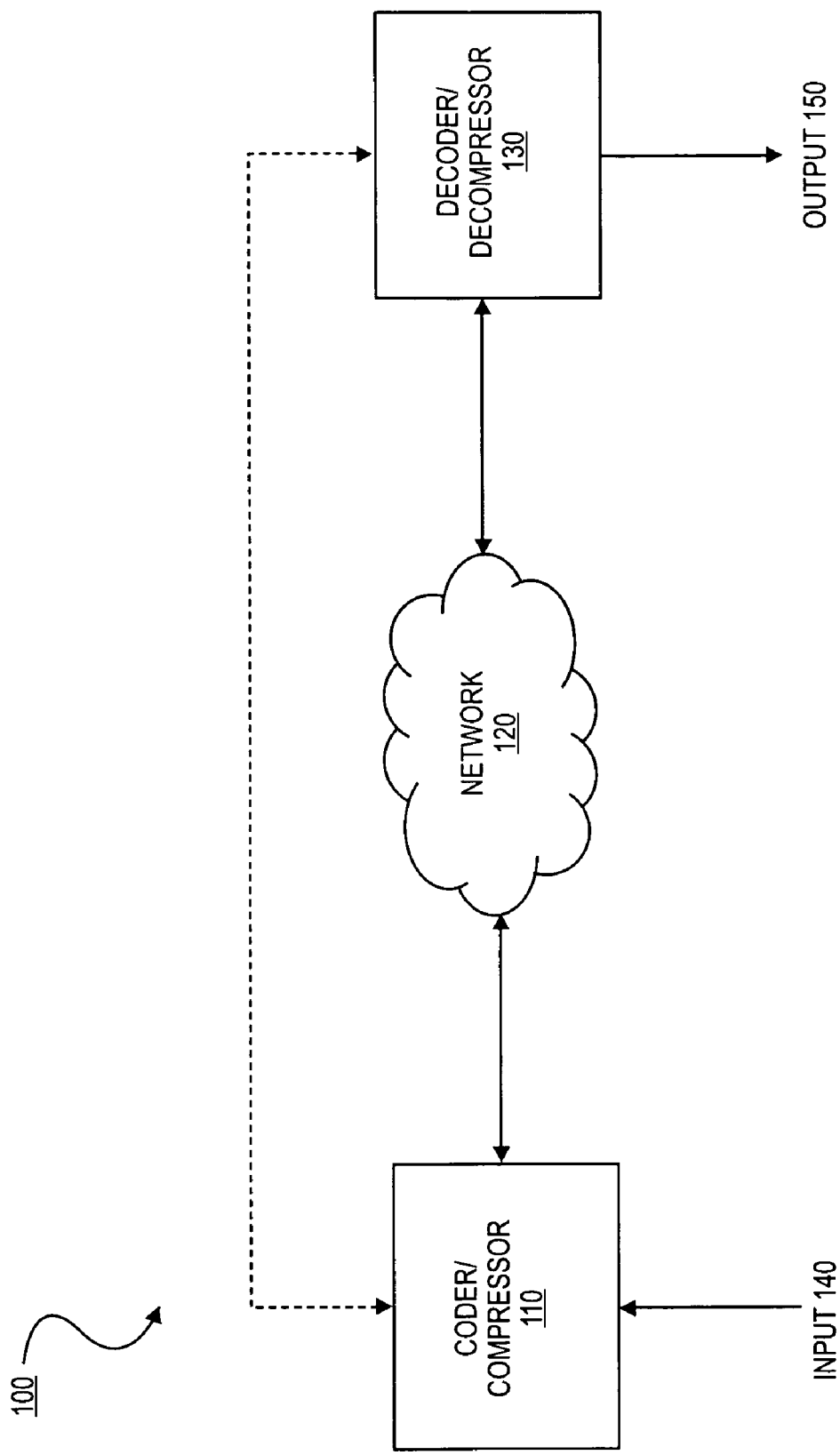
FIG. 1 is a block diagram depicting a system including an encoder and a decoder to perform embodiments of the invention.

Embodiments of the invention provide for modeling escape counts in adaptive compression models. In one embodiment, a method of modeling escape counts in adaptive compression models includes initializing an escape count for an escape symbol used in an adaptive compression context model that encodes an input stream, the initial escape count being initialized at a high value in an upper portion of a range of possible count values, invoking the adaptive compression context model with the initial escape count for the escape symbol, incrementing the escape count each time it is utilized in the adaptive compression context model, and scaling the escape count when it exceeds a maximum count value.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "sending", "receiving", "attaching", "forwarding", "caching", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Embodiments of the invention provide for modeling escape counts in adaptive compression models. In some embodiments, the adaptive compression models may be utilized to perform compression and decompression of a data stream. It is envisioned that embodiments of the invention may be utilized in a wide variety of data processing environments to compress and decompress any type of data stream in an optimal manner.

FIG. 1 is a block diagram depicting a system including an encoder (or compressor) 110 and a decoder (or decompressor) 130 to perform embodiments of the invention. Encoder 110 and decoder 130 may connected via a network 120 or directly (shown by dashed line). In some embodiments, network 120 may be a LAN, an internet, an extranet, or the Internet.

As shown, encoder 110 receives an input data stream 140 for coding or compression. This input data stream 140 may encompass a variety of embodiments, such as a document or an email message. Encoder 110 codes or compresses input data stream 140 and sends it to decoder 130 directly or via network 120. Input data stream 140 may be coded or compressed for security purposes, . . . , etc. Decoder 130 decodes or decompresses the received data stream from coder 110, and produces output data stream 150.

Figure 2:
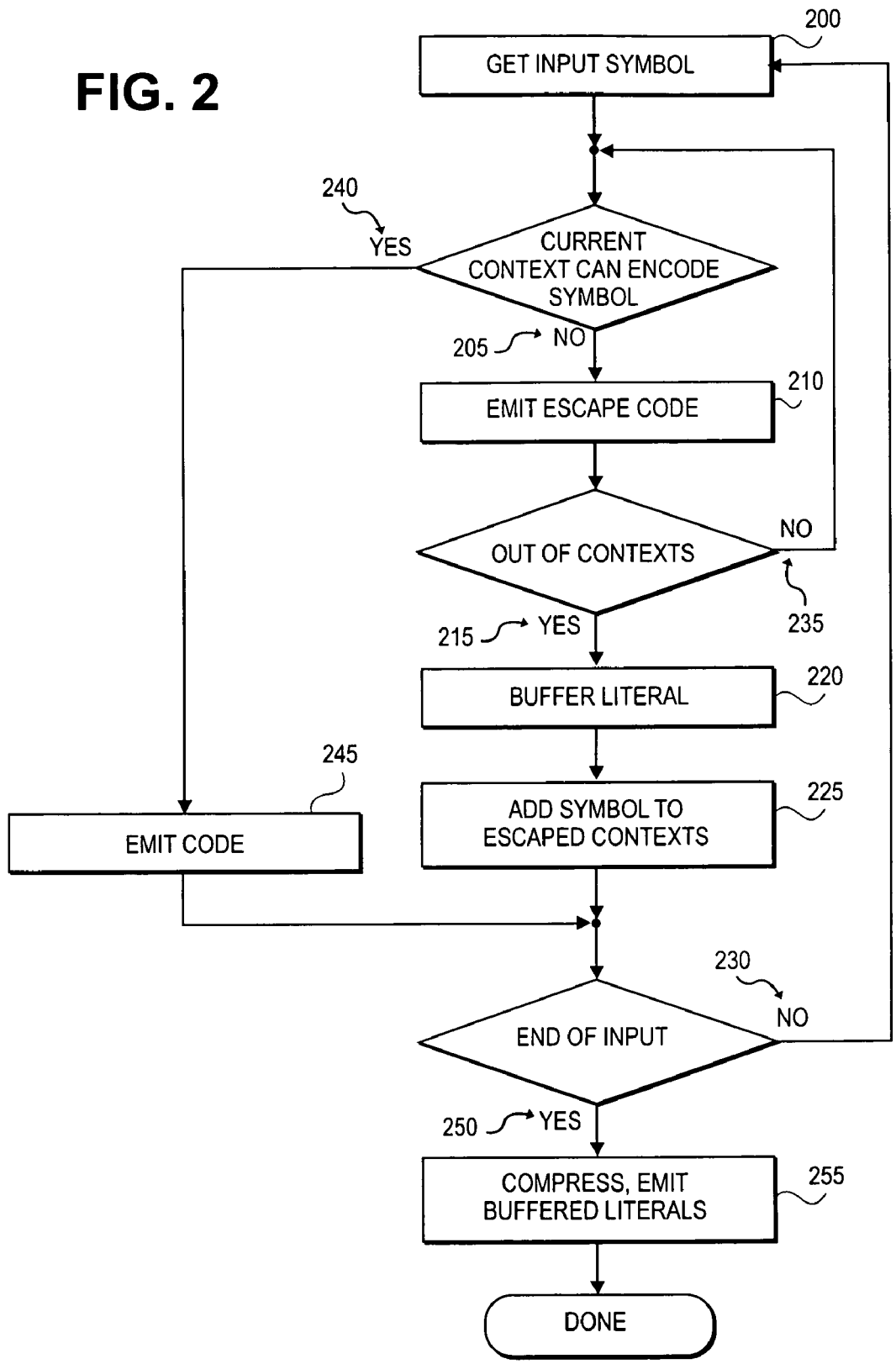
FIG. 2 shows an overview of an adaptive coding compression process according to an embodiment of the invention.

FIG. 2 is a flow diagram illustrating operations of an adaptive entropy coding compressor according to one embodiment of the invention. The method of FIG. 2 may be performed by processing logic that may comprise hardware (e.g., circuitry, dedicated logic, programmable logic, microcode, etc.), software (such as instructions run on a processing device), or a combination thereof. In some embodiments, the method of FIG. 2 is performed by encoder/compressor 110 of FIG. 1.

The following explanation will track the compressor through the flow chart as it processes an input string, "abracadabra". Compression can be thought of as building a model of the input data and picking a minimal set of clues about the model to send to a decompressor, so that the decompressor can replicate the model and reproduce the input string.

Figure 3:
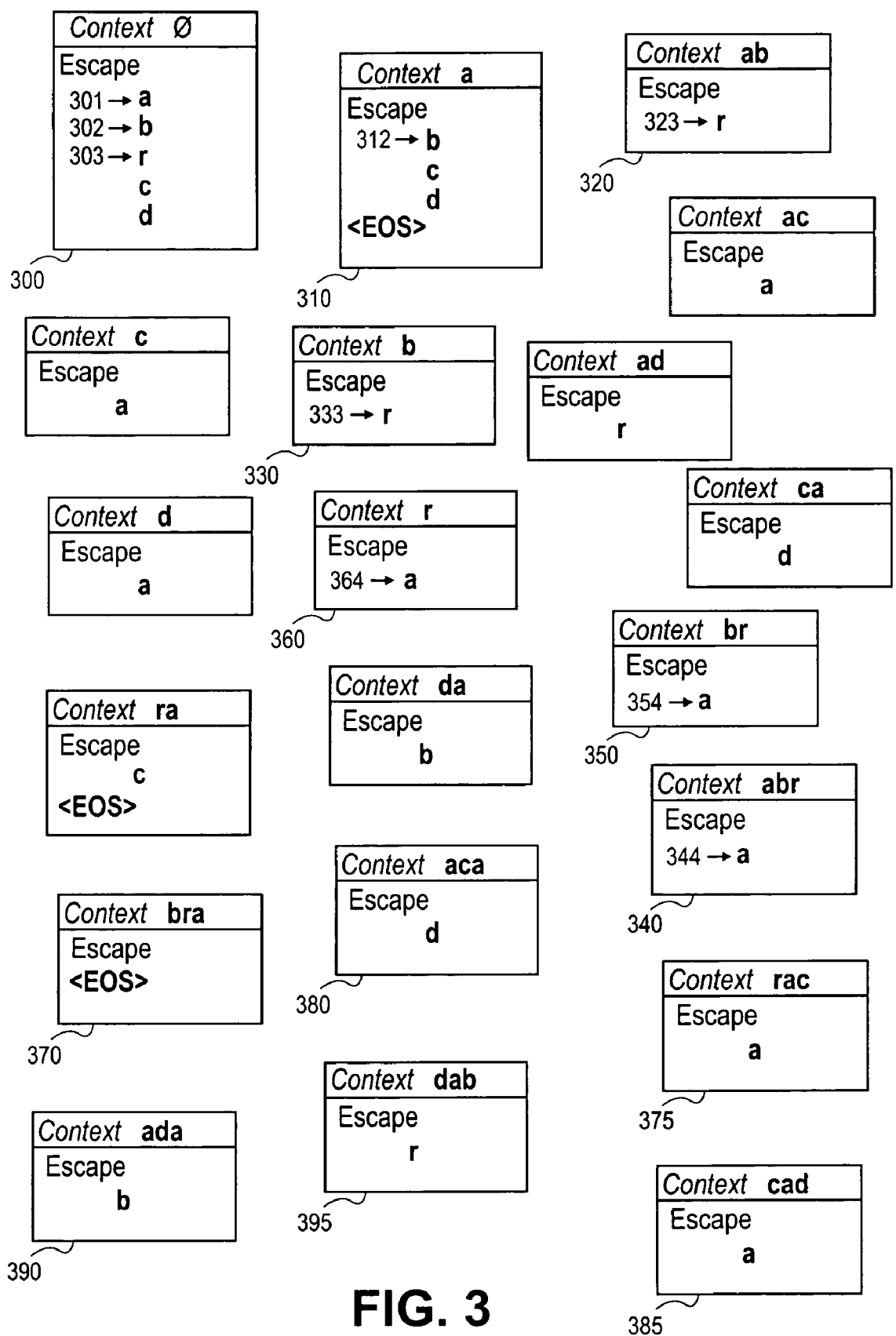
FIG. 3 shows the three-symbol contexts that are created as an embodiment of the invention compresses the string "abracadabra"

FIG. 3 shows "contexts" of the model according to certain embodiments of the invention. Each context corresponds to symbols the compressor has recently encoded (or symbols the decompressor has recently recovered). The compressor examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

According to one embodiment, as an example of an implementation, each context may be defined as a data structure as shown in FIG. 4. Referring to FIG. 4, each context includes a parent pointer pointing to a parent context of the current context (e.g., a shorter context). The root context would have the parent pointer as NULL or zero since it does not have any parent. Each context may also include one or more child contexts (e.g., longer contexts or next order contexts), where number of the child contexts depends on a specific application or configuration. In this example, it is assumed that there are 256 different symbols plus an escape symbol. The context structure further includes an array of count values, each count value corresponding to a symbol to be encoded or decoded. The count value may be used to represent the number of times the corresponding symbol has been processed. In one embodiment, the last entry of the count array may be used to store the number of escape symbol or code has been processed. Note that the data structure as shown in FIG. 4 is described for purposes of illustration only. Other formats or configurations may also exist.

Although all of the contexts, and the symbols each can encode, are shown in FIG. 3, they accumulate over time (as described below). The model starts out empty, with the initial context 300 (e.g., context Ø as a root context) able to encode only an escape symbol. The escape symbol is distinct from the 256 possible symbols that could be present in a stream of eight-bit characters.

The compressor retrieves the first input symbol (block 200), a. The current context, 300, cannot (yet) encode that symbol (block 205), so the compressor emits an escape token (block 210) and moves to a shorter context. As context 300 is the shortest (zero-character) context, the compressor is now out of contexts (block 215). As a result, it buffers the literal a (block 220) and adds a to each of the escaped contexts (block 225). In this case, the symbol a is added to context 300 (element 301 indicates the symbol a added to context 300.) At this point, the compressor has not reached the end of its input (block 230), so it loops back to get the next input symbol (block 200), the symbol b.

Figure 5:
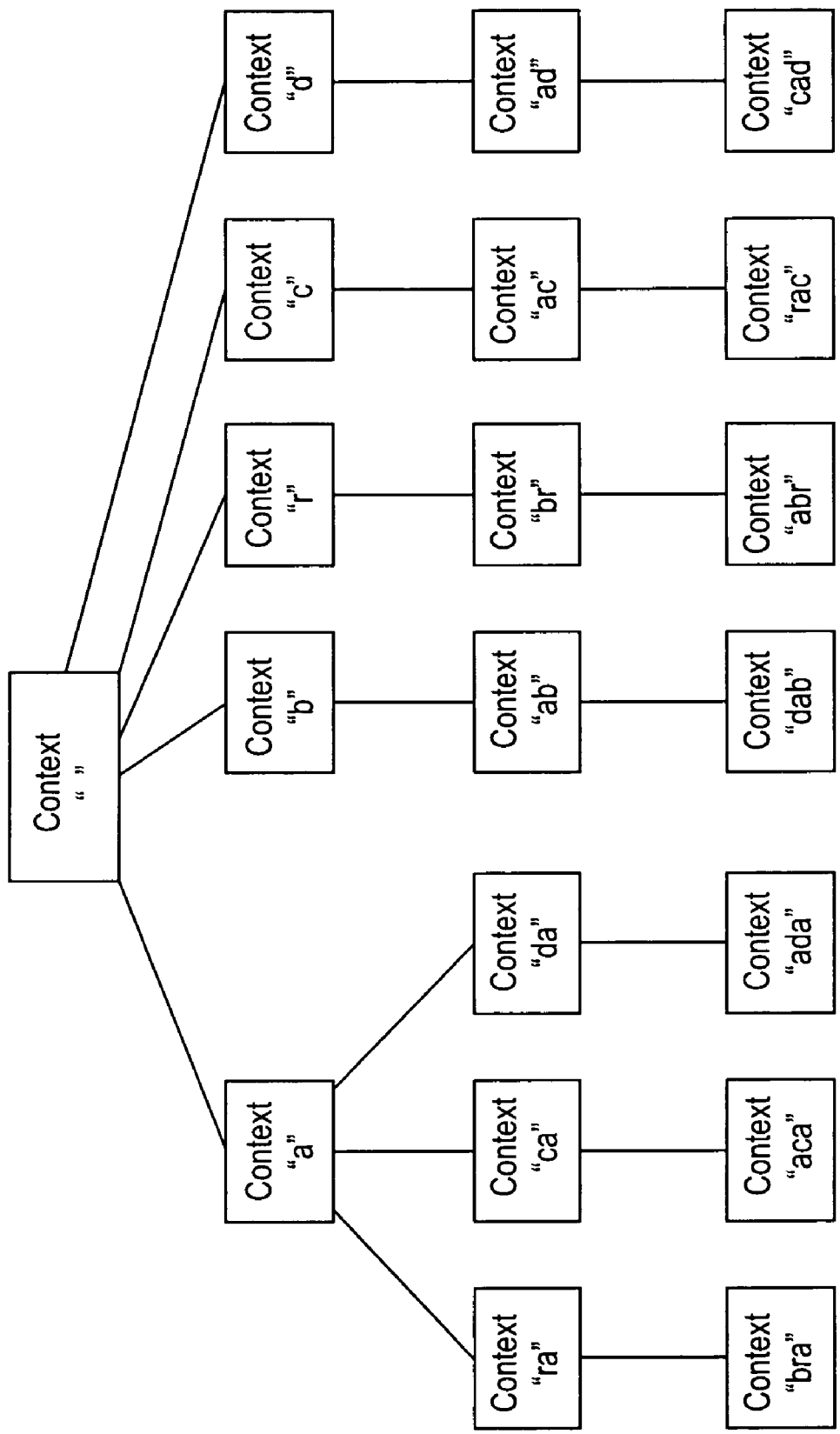

In embodiments of the invention, a child context is created having a parent pointer pointing to context 300, while context 300 has a child pointer pointing to the newly created child context, forming a tree structure similar to the one as shown in FIG. 5. In this example, context 310 (e.g., context "a") is created from context 300, where context "a" 310 includes a parent pointer pointing to context 300 and conversely context 300 includes a child pointer pointing to context "a" 310, as shown in FIG. 4. At this point in the compression, context "a" 310 can only encode an escape symbol. In some embodiments, the escape symbol is also referred to as "<Esc>" symbol, which may be considered implicit <Esc> symbol.

The next symbol in the string to compress is the symbol b. The compressor starts with the last context corresponding to the last symbol. This last context is context "a" 310. As context 310 cannot (yet) encode the symbol b (block 205), the compressor emits an escape token (block 210) and moves (e.g., escapes) to a shorter context. This shorter context is context 300 (e.g., the parent context of context "a") as shown in FIG. 5. As such, the compressor is not yet out of contexts (block 235), so it loops back to consider context 300.

Context 300 is also unable to encode the symbol b (block 205) (as it can currently encode only escape and a), so the compressor emits another escape token (block 210) and moves to a shorter context. However, context 300 is the shortest context, so the compressor is now out of contexts (block 215). The literal b is buffered and also added to each escaped context (blocks 302, 312), namely contexts 300 and 310. Thus far, the compressor has emitted three escapes and buffered two literals (a and b). Only the escape from context 300 on input symbol b required any bits to encode; all of the other escapes were from contexts that could only encode the escape and therefore did not require any bits to encode.

The next symbol to compress is r and the starting context for this character is ab 320, which corresponds to the last context with respect to "r" (e.g., for sequence of "abr" the last context having up to three symbols is context "ab"). Context 320 cannot encode the symbol r (block 205), so the compressor emits an escape token (block 210) and moves to the shorter context b 330 (e.g., parent context of context "b" as shown in FIG. 5). Context 330 also cannot encode the symbol r (block 205), so the compressor emits another escape token (block 210) and moves to the next-shortest context, which is context 300. Context 300 also cannot encode the symbol r (block 205), so the compressor emits another escape token (block 210), but is now out of contexts (block 215). As a result, the compressor creates a child context "r". Literal r is buffered and added to contexts 300, 320 and 330 (see 303, 323 and 333). The end of the input has still not been reached (block 230), so the compressor loops back yet again.

For the next input symbol, a, the compressor starts at context 340 and escapes through 340, 350 and 360 (adding coding 344, 354 and 364 to these contexts 350, 350, 360) before discovering that context 300 can encode the input symbol a (block 240). Therefore, the compressor emits the appropriate code (block 245) for the symbol a and loops back again.

The following Table 1 summarizes the activity of the compressor working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the compressor buffered a literal and updated one or more escaped-from contexts.

TABLE 1

| Symbol | Start Context | Escapes | Coding Context | Literal |
|--------|---------------|---------|----------------|---------|
| a | 300 Ø | 1 | | a |
| b | 310 a | 2 | | b |
| r | 320 ab | 3 | | r |
| a | 340 abr | 3 | 300 | |
| c | 370 bra | 4 | | c |
| a | 375 rac | 3 | 300 | |
| d | 380 aca | 4 | | d |
| a | 385 cad | 3 | 300 | |
| b | 390 ada | 3 | 300 | |
| r | 395 dab | 3 | 300 | |
| a | 340 abr | | 340 | |
| <EOS> | 370 bra | 4 | | <EOS> |

After escaping from context 370 and buffering the end-of-stream (EOS) literal, the compressor determines that the end of input has been reached (block 250). Now, it compresses the buffered literals and emits them in a discernible position relative to the encoded data bits (for example, at the beginning of the encoded stream, at the end of the stream, or at a block boundary in the stream).

Figure 6:
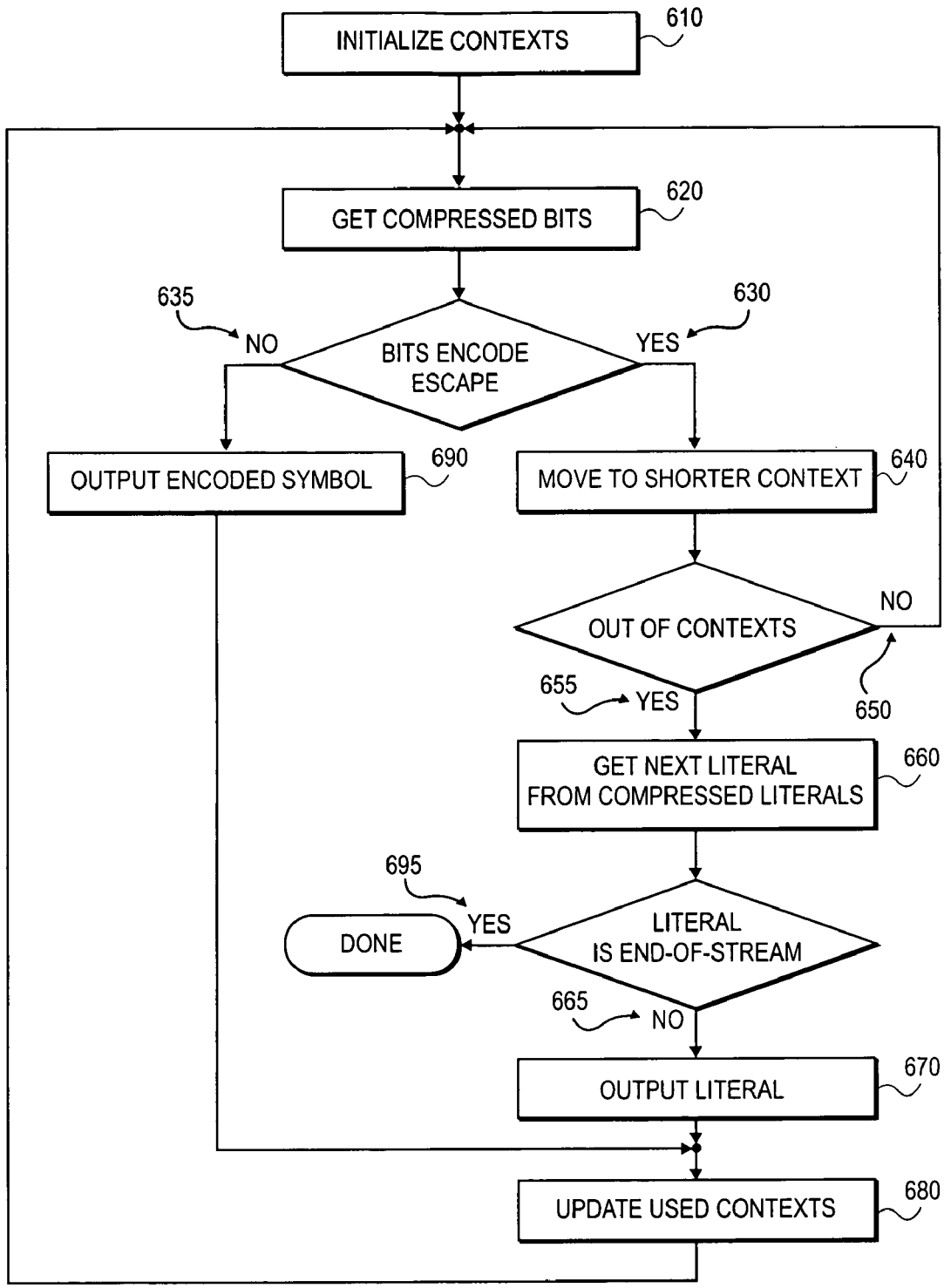
FIG. 6 is a flow diagram outlining decompression according to an embodiment of the invention.

FIG. 6 is a flow diagram outlining the operations of an entropy-coding data decompressor according to an embodiment of the invention. The method of FIG. 6 may be performed by processing logic that may comprise hardware (e.g., circuitry, dedicated logic, programmable logic, microcode, etc.), software (such as instructions run on a processing device), or a combination thereof. In some embodiments, the method of FIG. 6 is performed by decoder/decompressor 130 of FIG. 1.

The decompressor receives a compressed data stream previously compressed by a compressor, such as the compressor operating on the contexts described in FIG. 3. Referring to FIG. 6, the decompressor initializes its context model identically to the compressor's initialized model (block 610). Recall that despite the large number of contexts (shown in FIG. 3) that exist after compressing an input stream, the compressor and decompressor both start with just one context state, 300, which can encode just one symbol, an escape.

Next, the decompressor gets some compressed bits from the compressed data stream. The number of compressed bits necessary to decide what to do next varies depending on the state of the decompression context. For example, when decompression has just started and context 300 can only encode an escape, no bits are required. The decompressor knows that the compressor must have emitted an escape, because that is the only thing it could emit. Consequently, the escape is encoded in zero bits.

As the first compressed bits encode escape (block 630), the decompressor moves to a shorter context (block 640). However, because context 300 is already the shortest context, the decompressor is out of contexts (block 655) and requires a literal. It obtains the next literal from the literal decompressor (block 660), checks to ensure that it has not reached the end-of-stream (block 665), and outputs the literal as the reconstituted data (block 670). Referring to Table 1, it is clear that the first compressed literal was a, so that symbol is output. Any contexts used (e.g., escaped from) are updated (block 680), and the decompressor loops back to get more compressed bits (block 620). Note that no compressed bits have been used yet because no existing context could encode anything except an escape.

Now, the decompressor is in context 310, because it has just produced the symbol a. Context 310 is unable to encode any symbol except escape, so the decompressor again consumes zero bits to determine that the next encoded symbol is escape (block 630). Now, the decompressor moves to the next-shorter context (block 640), which is context 300. As it is not out of contexts (block 650), it loops back to get more compressed bits (block 620).

Context 300 currently encodes escape and the symbol a, so some information (at least a portion of a compressed bit) is required to decide which one of these two options was encoded. Utilizing the compressed bit, the decompressor determines that another escape is encoded (block 630). This is the third escape, which was mentioned previously. The decompressor tries to move to a shorter context (block 640), but it is now out of contexts (655). As a result, it gets the next literal from the compressed literals (block 660), notes that it is not end-of-stream (block 665), and outputs it (block 670). Recall that the second literal produced during compression was b. The contexts escaped from (310, 300) are updated (block 680) with the symbol b and the decompressor loops back again.

This process continues until the characters abr have been recovered and output. The decompressor is in context 340 and gets more compressed bits (block 620). Contexts 340, 350 and 360 only encode escapes, so no bits are consumed as the decompressor escapes to shorter contexts. When it reaches context 340, it discovers that the next compressed bits encode a (block 635), so it outputs this symbol (block 690), updates the appropriate contexts (680) and loops back to process more compressed bits.

The decompressor continues working through the compressed bits, extracting literals as necessary from the compressed literals block, until there are no more compressed bits to examine. At this point, the original input symbol sequence has been reconstituted and emitted. Note that the decompression process requires literals from the compressed block fairly early in its operations (in fact, the very first thing it does is infer an escape from zero compressed bits, extract a compressed literal and output it). Thus, it is important for the decompressor to have access to the compressed literals as soon as possible.

In a typical adaptive compression model, and as seen in the above example, the frequency of escape symbols is heavily weighted towards the beginning of the data stream. This is because the adaptive compression model starts out empty, so the first time a new character is encountered the escape symbol is emitted, eventually leading to the literal being outputted. The likelihood of a character being in the model increases over time and as more of the data stream is processed. As such, the farther into the processing of the data stream, the less likely an escape symbol will be utilized.

Embodiments of the invention provide a mechanism for escape counts to more accurately reflect their frequency in relation to their utilized position in the data stream. This mechanism takes advantage of an implementation detail of most PPM models, namely that the counts used for symbols in contexts are only 8 bits and that an overflow or scaling factor applies to these counts. A count size of 8 bits leads to a count range between 0 and 255 (255 being the max count). When the count of one of the symbols in a PPM table goes over 255, all of the counts in the table are scaled (typically, by dividing by 2).

Prior techniques for adaptive compression models kept the count of the escape code at a permanent value of 1 and this value was not scaled with the other symbols in the table. However, embodiments of the invention take advantage of the overflow factor and let the escape count evolve similar to other symbols in the model in order to more accurately reflect the escape's actual probability. This is accomplished by treating the escape as an ordinary symbol that increments, and also start the escape count with a large count value that will quickly get scaled.

Figure 7:
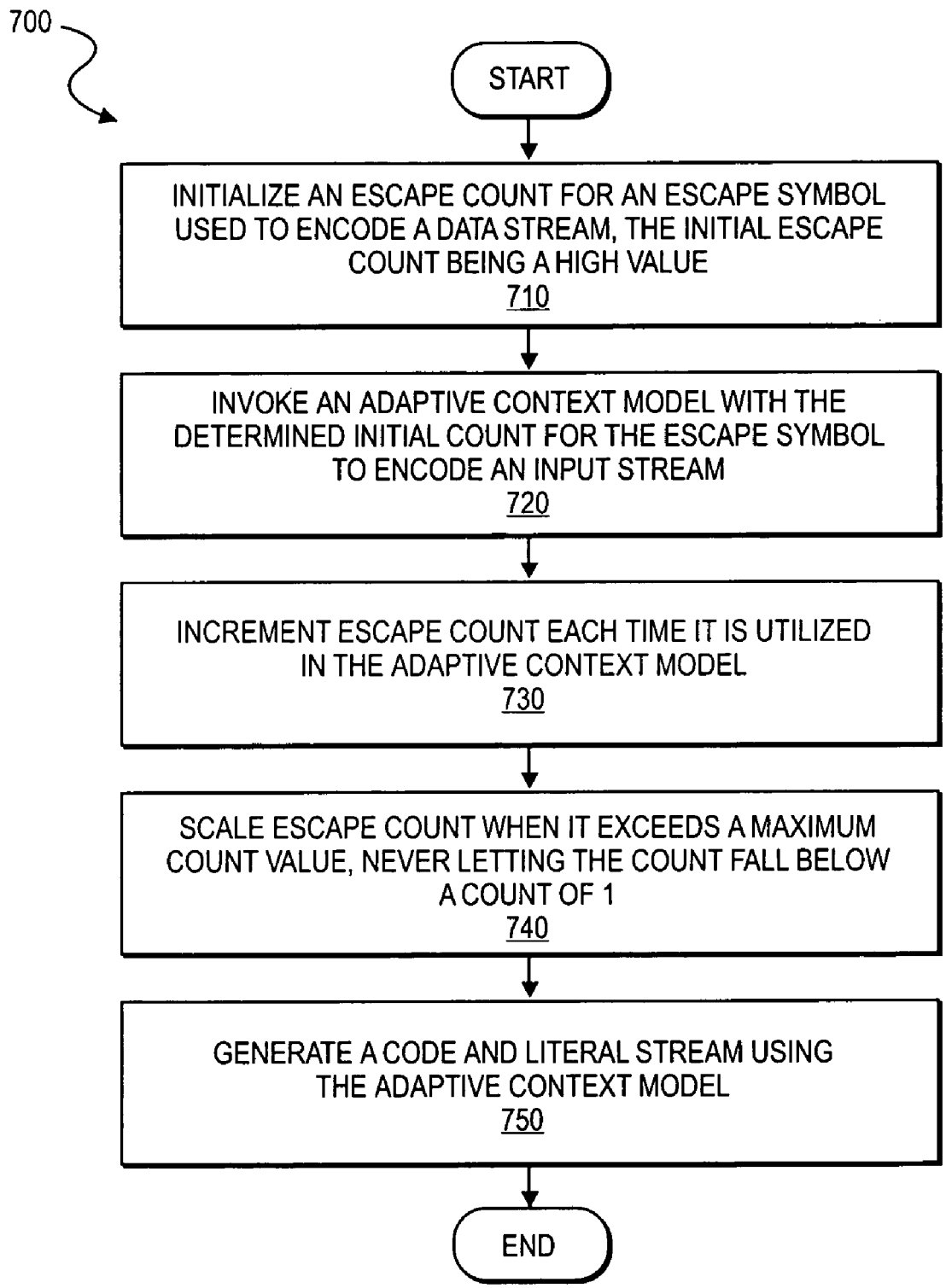
FIG. 7 is a flow diagram illustrating a process for modeling escape counts in an adaptive compression model according to one embodiment of the invention.

FIG. 7 is a flow diagram illustrating a method 700 for treatment of escape symbols and their respective counts according to an embodiment of the invention. Method 700 may be performed by processing logic that may comprise hardware (e.g., circuitry, dedicated logic, programmable logic, microcode, etc.), software (such as instructions run on a processing device), or a combination thereof. In some embodiments, the method 700 is performed by either of encoder/compressor 110 or decoder/decompressor 130 of FIG. 1.

Method 700 begins at block 710 where an escape count for an escape symbol is initialized with an arbitrary high value in the range of possible count values. This escape symbol is used to encode a data stream. In some embodiments, the value of the escape may be in the range of 252 or a similar value when the maximum count is 255. In some embodiments, the count may fall in the top 10 percentile of the total range of possible count values. However, one skilled in the art will appreciate that the exact count value is not integral to embodiments of the invention and that the initial escape count value may vary.

At block 720, an adaptive compression context model is invoked with the determined initial count value for the escape symbol to encode an input stream. At block 730, the escape count is incremented each time it is utilized in the adaptive compression context model. The escape count is also scaled when it exceeds a maximum count value allowed by the model at block 730. The scaling of the escape count is done is such a way as to never let the count value fall below 1. Finally, at block 750, a code stream and a literal stream is generated using the adaptive compression context model.

As noted in the above description related to FIG. 7, the scaling operation of embodiments of the invention should be careful not remove the escape symbol from the affected table by reducing its count to 0 (e.g., falling below the value of 1). In most scaling implementations, the count is scaled by dividing by 2. In this way, the count value truncates towards 0 by simply dropping the low order bit, which has the effect of removing items with a count of 1 from the table. For extremely low probability symbols this is not a bad idea because then the model will not take these symbols into consideration at all, thereby leading to a better compression ratio. However, for the escape symbol, its count should not reach zero (and thereby cause the escape to fall off the table) because then there would be no way to emit a literal when a particular symbol is not found in the model.

The following example highlights the importance of protecting the escape count. Assume a data stream is being encoded that was a couple thousand bytes long and had a symbol z at the beginning of the stream and then at the end of the stream. For example, a data stream may be discussing a trip to zoo and listing each animal seen in alphabetical order. When the end of the list is reached, a zebra is mentioned. By the time the second z of the word zebra is reached, the symbol z from the beginning of the stream will most likely have fallen off the compression table due to the scaling factor. If escape symbols are allowed to go to 0, similar to the z symbol, then the escape cannot be encoded and anything that is not already in the model, such as the second z symbol, will also not be able to be encoded.

In some embodiments of the invention, to prevent an escape symbol from falling off a table due to scaling, a count of 1 that is being scaled is replaced with a 1 (instead of dividing by 2). In some embodiments, this may be done globally throughout all symbols with counts of 1 in the entire table. In other embodiments, it may be done locally by replacing only an escape count value of 1 with a 1 and letting all other symbols fall off the table.

Another problem that may be encountered with embodiments of the invention is the fact that starting an escape count with an arbitrarily high count in a context that can only predict a small range of values may not be helpful. For example, with coding by a context that ends with letter Q, chances are the only thing that will ever be seen in that context is the letter U. As a result, every time the letter U is encountered it will have the large weight of the escape count there, when in such a situation the escape will rarely, if ever, be utilized.

For deeper contexts (e.g., longer contexts), such as the above case with the letter Q, embodiments of the invention may be provide for different escape count values at each level of the model (instead of having a single global value for escape counts at all levels). For example, when reaching the abr context 340 of FIG. 3, the only thing that will be generated from that point forward in this particular string is the letter a. In that case, a high escape count is not useful for the compression ratio. This underscores why embodiments of the invention may be more useful in low level contexts (e.g., the empty string context) than higher-level contexts—because the deeper the context goes the smaller the set of characters that are encountered.

To implement the embodiment providing various escape count initialization based on the level of the mode, the model may begin with a high count (e.g., 252 or 253) for the empty string table. But, for next table, the escape count might start a bit higher than the empty string table to enable the count to scale more quickly than the empty string context.

For context tables after the first level, the escape count may be started with a fairly low value (e.g., 1 or 2). In that case, the first time through the model will emit the escape symbol (effectively using only 0 bits to encode because escape is only thing that can be predicted). This embodiment may not be as optimal as being able to encode with 1 bit if the escape was not being treated as an ordinary symbol, but may add overall efficiency to the model due to the gains in compression ratio on the other levels of the model.

For the purpose of illustration, the same example of sequence "abracadabra" is utilized herein. With an order-0 model, the code stream would be <escape>-<escape>-<escape>-"a"-<escape>-"a"-<escape>-"a"-"b"-"r"-"a". Assume a high initialization value of 253 for the escape count, with a scaling factor applied to the escape count. A table of escape counts for each symbol would evolve as shown in FIG. 7.

Figure 8:
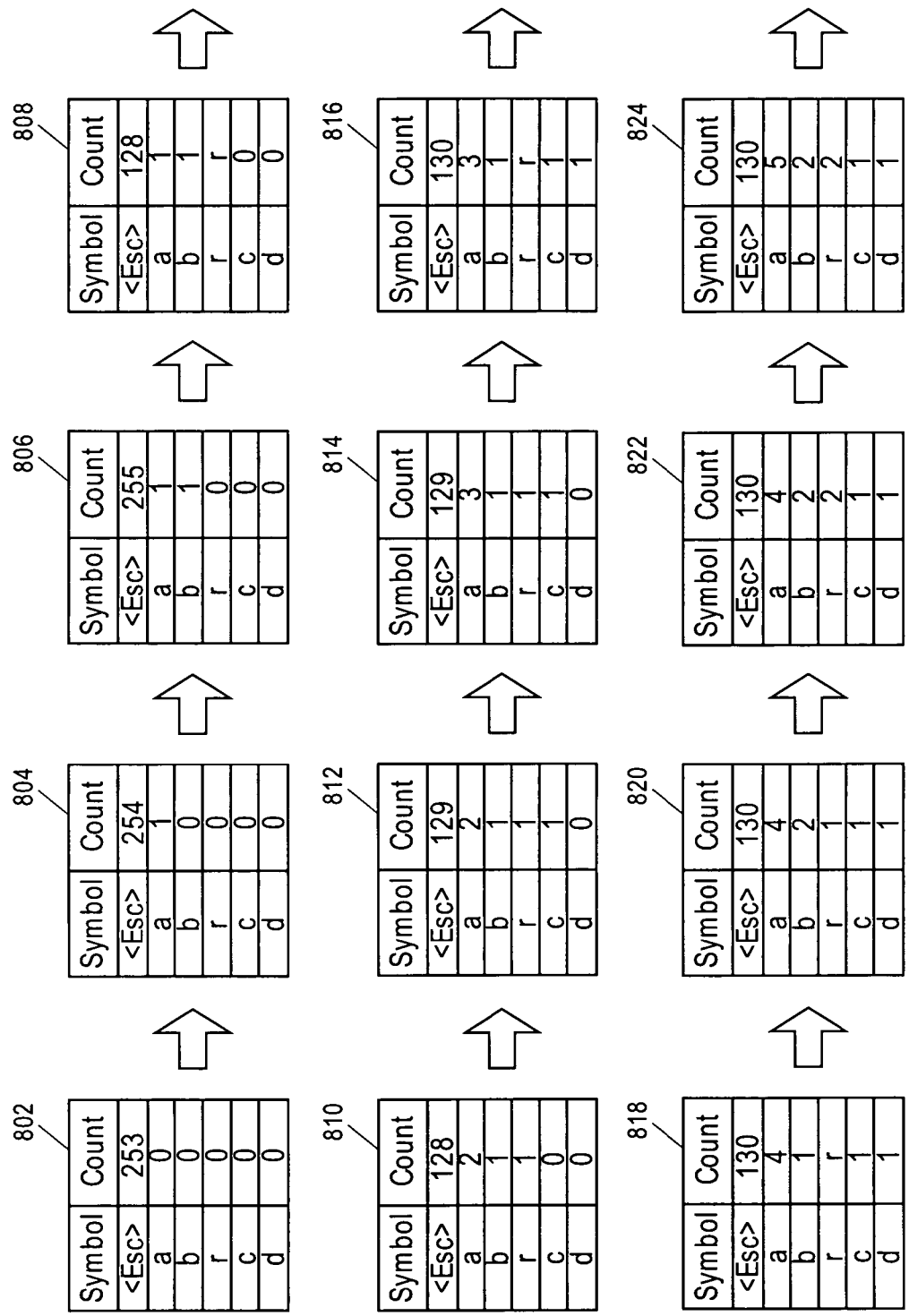
FIG. 8 is a data diagram illustrating an evolution of symbol counts in an adaptive compression escape sequence according to one embodiment of the invention.

Referring to FIG. 8, the table starts with table 802. This is the empty string context that starts with an initial value of 253 for the escape context. When "a" is encoded, the table becomes table 804 where the count for symbol a increases to 1 and the escape count goes from 253 to 254. Then, the symbol "b" is encoded, and the table becomes table 806. Because the symbol "b" cannot be encoded, it brings the escape count to 255 and the count for "b" to 1.

Then, the symbol "r" is reached and it also cannot be encoded, so the escape is emitted and the table becomes table 808. The escape count would go from 255 to 256. However, as the count cannot go that high with 8 bit counts, it will need to be scaled. This is one of the cases where scaling will wipe out all of the other symbols that are in the table, so in this case the 1 count values may be preserved, resulting in just the escape going from 255 to 128 while all other count values remain the same. Next, the symbol "a" is encountered again. This time it can be encoded directly, so the count for "a" goes from 1 to 2 in table 810. The symbol "c" is encountered next, which uses an escape, and as shown in table 812, the escape count goes to 129 and add the "c" count goes to 1.

Similarly, when the rest of the stream (i.e., "adabra") is encoded, the tables are updated from table 814 to 824 as shown in FIG. 8. Going through all of these tables as shown in FIG. 8, it can be seen that the modeling of escape counts may contribute to a more accurate representation of the escape probability based on its presence in the code stream. The following Table 2 depicts the evolution of probabilities based on setting the escape count to a high initial value and allowing it to scale.

TABLE 2

| Letter | Probability |
|---|---|
| A | 253/253 (=1) |
| B | 254/255 |
| R | 255/257 |
| A | 1/131 |
| C | 128/132 |
| A | 2/134 |
| D | 129/135 |
| A | 3/137 |
| B | 1/138 |
| R | 1/139 |
| A | 4/140 |

Figure 9:
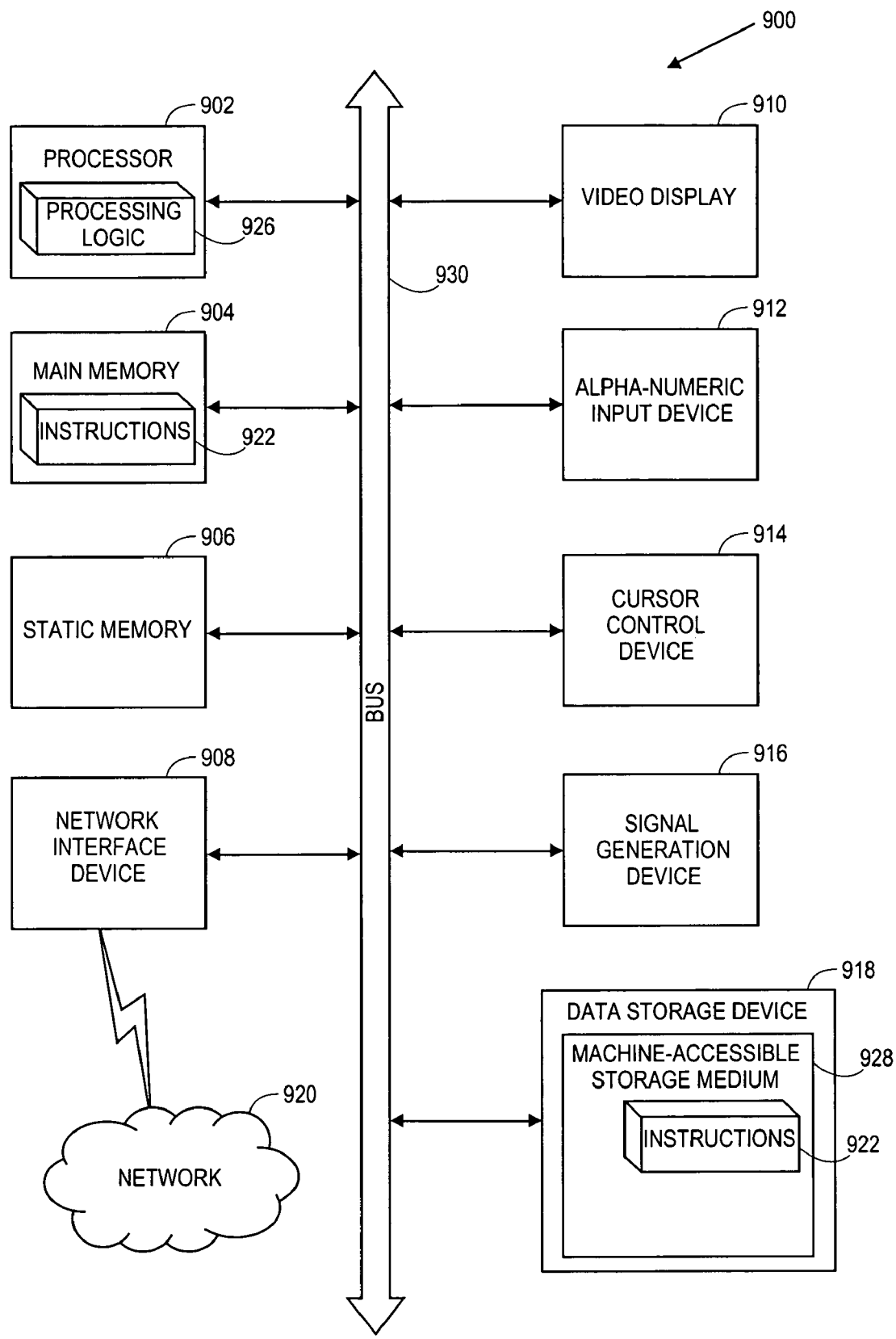
FIG. 9 illustrates a block diagram of one embodiment of a computer system.

FIG. 9 illustrates a diagrammatic representation of a machine in the exemplary form of a computer system 900 within which a set of instructions, for causing the machine to perform any one or more of the methodologies discussed herein, may be executed. In alternative embodiments, the machine may be connected (e.g., networked) to other machines in a LAN, an internet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. For example, system 900 may be used as part of a system, such as an encoder 110 or a decoder 130 described with respect to FIG. 1, to perform the coding processes set forth above.

The exemplary computer system 900 includes a processing device 902, a main memory 904 (e.g., read-only memory (ROM), flash memory, dynamic random access memory (DRAM) (such as synchronous DRAM (SDRAM) or Rambus DRAM (RDRAM), etc.), a static memory 906 (e.g., flash memory, static random access memory (SRAM), etc.), and a data storage device 918, which communicate with each other via a bus 930.

Processing device 902 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 is configured to execute the processing logic 926 for performing the operations and steps discussed herein.

The computer system 900 may further include a network interface device 908. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 916 (e.g., a speaker).

The data storage device 918 may include a machine-accessible storage medium 928 on which is stored one or more set of instructions (e.g., software 922) embodying any one or more of the methodologies of functions described herein. The software 922 may also reside, completely or at least partially, within the main memory 904 and/or within the processing device 902 during execution thereof by the computer system 900; the main memory 904 and the processing device 902 also constituting machine-accessible storage media. The software 922 may further be transmitted or received over a network 920 via the network interface device 908.

The machine-readable storage medium 928 may also be used to store instructions that perform the coding processes set forth above, and/or a software library may contain the methods that call the above applications. While the machine-accessible storage medium 928 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the present invention. The term "machine-accessible storage medium" shall accordingly be taken to include, but not be limited to, solid-state memories, and optical and magnetic media.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A computer-implemented method, comprising:
   initializing an escape count for an escape symbol used in an adaptive compression context model that encodes an input stream, the initial escape count being initialized at a high value falling in an upper portion of a range of possible count values;
   invoking the adaptive compression context model with the initial escape count for the escape symbol;
   incrementing the escape count each time it is utilized in the adaptive compression context model; and
   scaling the escape count when it exceeds a maximum count value.

2. The method of claim 1, wherein the upper portion of the range of possible count value includes the values in a top 10% of the range.

3. The method of claim 1, wherein scaling the escape count includes dividing the escape count by 2.

4. The method of claim 1, wherein scaling the escape count includes not letting the value of the escape count fall below 1.

5. The method of claim 1, wherein the escape count is tracked by an 8-bit value and the maximum count value is 255.

6. The method of claim 1, further comprising generating a code stream and a literal stream using the adaptive compression context model.

7. The method of claim 1, wherein scaling the escape count further includes scaling one or more counts of other symbols in the adaptive compression context model while not letting the one or more counts of the other symbols fall below 1.

8. The method of claim 1, wherein initializing the escape count further includes setting one or more initial escape counts associated with one or more levels in the adaptive compression context model to different count values based upon an order in a hierarchy of the adaptive compression context model the one or more levels fall.

9. A system, comprising:
   a processor;
   a memory communicably coupled to the processor to store a data stream; and
   an encoder communicably coupled to the processor and the memory, the encoder operable to:
   receive the data stream;
   initialize an escape count for an escape symbol used in an adaptive compression context model that encodes the data stream, the initial escape count being initialized at a value in an upper portion of a range of possible count values;
   invoke the adaptive compression context model with the initial escape count for the escape symbol;
   increment the escape count each time it is utilized in the adaptive compression context model;
   scale the escape count when it exceeds a maximum count value; and
   generate a code and a literal stream using the adaptive compression context model.

10. The system of claim 9, wherein the upper portion of the range of possible count value includes the values in a top 10% of the range.

11. The system of claim 9, wherein scaling the escape count includes dividing the escape count by 2.

12. The system of claim 9, wherein scaling the escape count includes not letting the value of the escape count fall below 1.

13. The system of claim 9, wherein the escape count is tracked by an 8-bit value and the maximum count value is 255.

14. The system of claim 9, wherein scaling the escape count further includes scaling one or more counts of other symbols in the adaptive compression context model while not letting the one or more counts of the other symbols fall below 1.

15. The system of claim 9, wherein initializing the escape count further includes setting one or more initial escape counts associated with one or more levels in the adaptive compression context model to different count values based upon an order in a hierarchy of the adaptive compression context model the one or more levels fall.

16. An article of manufacture comprising a machine-readable storage medium including data that, when accessed by a machine, cause the machine to perform operations comprising:

initializing an escape count for an escape symbol used in an adaptive compression context model that encodes an input stream, the initial escape count being initialized at a value in an upper portion of a range of possible count values;

invoking the adaptive compression context model with the initial escape count for the escape symbol;

incrementing the escape count each time it is utilized in the adaptive compression context model; and scaling the escape count when it exceeds a maximum count, the scaling including not letting the value of the escape count fall below 1.

17. The article of manufacture of claim 16, wherein the upper portion of the range of possible count value includes the values in a top 10% of the range.

18. The article of manufacture of claim 16, wherein the escape count is tracked by an 8-bit value and the maximum count value is 255.

19. The article of manufacture of claim 16, wherein scaling the escape count further includes scaling one or more counts of other symbols in the adaptive compression context model while not letting the one or more counts of the other symbols fall below 1.

20. The article of manufacture of claim 16, wherein initializing the escape count further includes setting one or more initial escape counts associated with one or more levels in the adaptive compression context model to different count values based upon an order in a hierarchy of the adaptive compression context model the one or more levels fall.

\* \* \* \* \*